United States Patent
Hyot et al.

(10) Patent No.: US 10,636,653 B2
(45) Date of Patent: Apr. 28, 2020

(54) PROCESS FOR GROWING AT LEAST ONE NANOWIRE USING A TRANSITION METAL NITRIDE LAYER OBTAINED IN TWO STEPS

(71) Applicants: COMMISSARIAT A L'ENERGIE ATOMIQUE ET AUX ENERGIES ALTERNATIVES, Paris (FR); ALEDIA, Grenoble (FR)

(72) Inventors: Bérangère Hyot, Eybens (FR); Benoit Amstatt, Grenoble (FR); Marie-Françoise Armand, Vaulnaveys-le-haut (FR); Florian Dupont, Grenoble (FR)

(73) Assignees: COMMISSARIAT A L'ENERGIE ATOMIQUE ET AUX ENERGIES ALTERNATIVES, Paris (FR); ALEDIA, Grenoble (FR)

( * ) Notice: Subject to any disclaimer, the term of this patent is extended or adjusted under 35 U.S.C. 154(b) by 0 days.

(21) Appl. No.: 14/438,480

(22) PCT Filed: Oct. 25, 2013

(86) PCT No.: PCT/EP2013/072424
§ 371 (c)(1),
(2) Date: Apr. 24, 2015

(87) PCT Pub. No.: WO2014/064263
PCT Pub. Date: May 1, 2014

(65) Prior Publication Data
US 2015/0279672 A1    Oct. 1, 2015

(30) Foreign Application Priority Data
Oct. 26, 2012 (FR) .................... 12 60208

(51) Int. Cl.
*H01L 21/02* (2006.01)
*C30B 25/00* (2006.01)
(Continued)

(52) U.S. Cl.
CPC ...... *H01L 21/02609* (2013.01); *C30B 25/005* (2013.01); *C30B 25/183* (2013.01);
(Continued)

(58) Field of Classification Search
None
See application file for complete search history.

(56) References Cited

U.S. PATENT DOCUMENTS 5,254,499 A * 10/1993 Sandhu ............ H01L 21/28512
257/E21.162
5,580,823 A    12/1996 Hegde et al.
(Continued)

FOREIGN PATENT DOCUMENTS

CN    101330099 A    12/2008
CN    102255018 A    11/2011
(Continued)

OTHER PUBLICATIONS

International Search Report dated Jun. 5, 2014 issued in corresponding application No. PCT/EP2013/072424.
(Continued)

*Primary Examiner* — David E Graybill
(74) *Attorney, Agent, or Firm* — Seckel IP, PLLC

(57) ABSTRACT

The process for growing at least one semiconductor nanowire (3), said growth process comprising a step of forming, on a substrate (1), a nucleation layer (2) for the growth of the nanowire (3) and a step of growth of the nanowire (3). The step of formation of the nucleation layer (2) comprises the following steps: deposition onto the substrate (1) of a layer of a transition metal (4) chosen from Ti,
(Continued)

Figure 1:
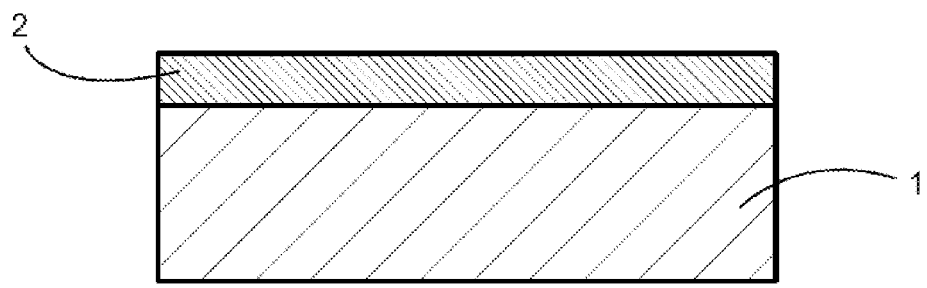

V, Cr, Zr, Nb, Mo, Hf, Ta; nitridation of at least a part (2) of the transition metal layer so as to form a transition metal nitride layer having a surface intended for growing the nanowire (3).

20 Claims, 4 Drawing Sheets

(51) Int. Cl.
| | |
|---|---|
| C30B 25/18 | (2006.01) |
| C30B 29/16 | (2006.01) |
| C30B 29/36 | (2006.01) |
| C30B 29/40 | (2006.01) |
| C30B 29/60 | (2006.01) |
| H01L 21/66 | (2006.01) |
| H01L 33/06 | (2010.01) |
| H01L 33/00 | (2010.01) |
| B82Y 20/00 | (2011.01) |
| H01L 33/16 | (2010.01) |
| B82Y 40/00 | (2011.01) |

(52) U.S. Cl.
CPC .............. *C30B 29/16* (2013.01); *C30B 29/36* (2013.01); *C30B 29/403* (2013.01); *C30B 29/605* (2013.01); *H01L 21/0254* (2013.01); *H01L 21/02491* (2013.01); *H01L 21/02516* (2013.01); *H01L 21/02603* (2013.01); *H01L 21/02614* (2013.01); *H01L 21/02639* (2013.01); *H01L 21/02658* (2013.01); *H01L 22/12* (2013.01); *H01L 33/007* (2013.01); *H01L 33/06* (2013.01); *B82Y 20/00* (2013.01); *B82Y 40/00* (2013.01); *H01L 21/02653* (2013.01); *H01L 33/16* (2013.01); *H01L 2924/0002* (2013.01)

(56) References Cited

U.S. PATENT DOCUMENTS

| | | | |
|---|---|---|---|
| 5,593,511 A * | 1/1997 | Foster | C23C 8/36 148/237 |
| 5,628,829 A * | 5/1997 | Foster | C23C 16/4417 118/723 E |
| 6,093,645 A * | 7/2000 | Ameen | C23C 8/02 257/E21.584 |
| 6,297,063 B1 | 10/2001 | Brown et al. | |
| 6,447,838 B1 * | 9/2002 | Azuma | H01L 28/55 257/E21.009 |
| 6,617,060 B2 | 9/2003 | Weeks, Jr. | C30B 23/02 257/E21.125 |
| 6,818,061 B2 * | 11/2004 | Peczalski | C30B 25/02 117/104 |
| 7,098,144 B2 * | 8/2006 | Zhang | B82Y 10/00 257/43 |
| 7,255,745 B2 * | 8/2007 | Zhang | C30B 25/005 117/89 |
| 7,335,908 B2 * | 2/2008 | Samuelson | B82Y 10/00 257/12 |
| 7,354,850 B2 * | 4/2008 | Seifert | B01J 23/52 257/E21.126 |
| 7,365,374 B2 * | 4/2008 | Piner | H01L 21/0237 257/183 |
| 7,682,943 B2 * | 3/2010 | Samuelson | B82Y 10/00 438/478 |
| 7,745,813 B2 * | 6/2010 | Samuelson | B82Y 10/00 257/12 |
| 7,791,106 B2 * | 9/2010 | Piner | H01L 21/0237 257/16 |
| 7,829,443 B2 | 11/2010 | Seifert et al. | |
| 7,911,035 B2 * | 3/2011 | Seifert | B01J 23/52 257/615 |
| 8,049,203 B2 * | 11/2011 | Samuelson | B82Y 10/00 257/13 |
| 8,105,921 B2 * | 1/2012 | Weeks, Jr. | C30B 23/02 438/36 |
| 8,450,717 B1 * | 5/2013 | Samuelson | B82Y 10/00 257/13 |
| 8,772,626 B2 * | 7/2014 | Samuelson | B82Y 10/00 136/255 |
| 8,928,034 B2 * | 1/2015 | Weeks, Jr. | C30B 23/02 257/183 |
| 8,928,035 B2 * | 1/2015 | Weeks, Jr. | C30B 23/02 257/183 |
| 8,937,335 B2 * | 1/2015 | Weeks, Jr. | C30B 23/02 257/183 |
| 8,986,835 B2 * | 3/2015 | Wildeson | B82Y 30/00 117/87 |
| 9,679,966 B2 * | 6/2017 | Hyot | H01L 29/0676 |
| 9,698,011 B2 * | 7/2017 | Hyot | H01L 21/02609 |
| 2001/0001954 A1 * | 5/2001 | Urabe | C23C 16/4581 118/728 |
| 2002/0007881 A1 | 6/2002 | Cuomo et al. | |
| 2002/0086534 A1 | 7/2002 | Cuomo et al. | |
| 2002/0117677 A1 | 8/2002 | Okuyama et al. | |
| 2002/0197825 A1 | 12/2002 | Usui et al. | |
| 2003/0102444 A1 * | 6/2003 | Deppert | B05D 1/007 250/492.22 |
| 2004/0004242 A1 | 1/2004 | Yamamoto | |
| 2004/0075464 A1 * | 4/2004 | Samuelson | B82Y 10/00 326/37 |
| 2004/0132315 A1 | 7/2004 | Chambers et al. | |
| 2005/0006673 A1 * | 1/2005 | Samuelson | B82Y 10/00 257/232 |
| 2005/0233093 A1 * | 10/2005 | Tada | C23C 16/4408 427/569 |
| 2006/0019470 A1 * | 1/2006 | Seifert | B01J 23/52 438/483 |
| 2006/0048866 A1 | 3/2006 | Takada et al. | |
| 2006/0086314 A1 * | 4/2006 | Zhang | C30B 25/005 117/98 |
| 2006/0099758 A1 * | 5/2006 | Zhang | B82Y 10/00 438/222 |
| 2006/0270200 A1 | 11/2006 | Shibata | |
| 2007/0248132 A1 | 10/2007 | Kikuchi et al. | |
| 2008/0017278 A1 | 1/2008 | Nagae et al. | |
| 2008/0036038 A1 | 2/2008 | Hersee et al. | |
| 2008/0057344 A1 * | 3/2008 | Murakami | C23C 16/34 428/698 |
| 2008/0105296 A1 * | 5/2008 | Samuelson | B82Y 10/00 136/255 |
| 2008/0142784 A1 * | 6/2008 | Samuelson | B82Y 10/00 257/14 |
| 2008/0142926 A1 * | 6/2008 | Seifert | B01J 23/52 257/615 |
| 2008/0149914 A1 * | 6/2008 | Samuelson | B82Y 10/00 257/9 |
| 2008/0149944 A1 * | 6/2008 | Samuelson | B82Y 10/00 257/88 |
| 2008/0188064 A1 * | 8/2008 | Samuelson | B82Y 10/00 438/488 |
| 2008/0224115 A1 | 9/2008 | Bakkers et al. | |
| 2008/0233692 A1 | 9/2008 | Yu et al. | |
| 2008/0261378 A1 | 10/2008 | Yao et al. | |
| 2009/0098343 A1 | 4/2009 | Arena et al. | |
| 2009/0289370 A1 * | 11/2009 | Besser | C23C 18/1607 257/768 |
| 2009/0321738 A1 | 12/2009 | Kim et al. | |
| 2010/0096614 A1 | 4/2010 | Kim et al. | |
| 2010/0124025 A1 | 5/2010 | Yamaguchi et al. | |
| 2010/0133509 A1 | 6/2010 | Kawashima et al. | |
| 2010/0163840 A1 | 7/2010 | Seifert et al. | |
| 2010/0276664 A1 | 11/2010 | Hersee | |
| 2010/0283064 A1 | 11/2010 | Samuelson et al. | |
| 2011/0062453 A1 | 3/2011 | Armitage | |
| 2011/0079766 A1 | 4/2011 | Wildeson et al. | |
| 2011/0127490 A1 | 6/2011 | Mi | |

(56) References Cited

U.S. PATENT DOCUMENTS

| | | | |
|---|---|---|---|
| 2011/0133160 A1 | 6/2011 | Yu et al. | |
| 2011/0140072 A1 | 6/2011 | Varangis et al. | |
| 2012/0001303 A1 | 1/2012 | Huang et al. | |
| 2012/0045903 A1 | 2/2012 | Harada et al. | |
| 2012/0061646 A1 | 3/2012 | Yi et al. | |
| 2012/0068153 A1 | 3/2012 | Seong et al. | |
| 2012/0187376 A1 | 7/2012 | Tomioka et al. | |
| 2012/0205613 A1 | 8/2012 | Mi et al. | |
| 2012/0313078 A1 | 12/2012 | Fukui et al. | |
| 2013/0127099 A1 | 5/2013 | Mimura et al. | |
| 2013/0146835 A1* | 6/2013 | Samuelson | B82Y 10/00 257/13 |
| 2013/0207075 A1 | 8/2013 | Myers et al. | |
| 2013/0221322 A1 | 8/2013 | Ohlsson | |
| 2014/0061832 A1* | 3/2014 | Emboras | G02F 1/025 257/431 |
| 2014/0080290 A1 | 3/2014 | Eymery et al. | |
| 2014/0097401 A1* | 4/2014 | Robin | H01L 33/06 257/13 |
| 2014/0117308 A1 | 5/2014 | Hyot et al. | |
| 2014/0120637 A1 | 5/2014 | Hyot et al. | |
| 2015/0027523 A1* | 1/2015 | Samuelson | B82Y 10/00 136/256 |
| 2015/0280053 A1 | 10/2015 | Gilet et al. | |
| 2015/0333225 A1 | 11/2015 | Samuelson et al. | |

FOREIGN PATENT DOCUMENTS

| | | | | |
|---|---|---|---|---|
| DE | 10 2010 012711 A1 | 9/2011 | | |
| EP | 1 246 233 A2 | 10/2002 | | |
| EP | 1 796 180 A1 | 6/2007 | | |
| EP | 2284868 A1 * | 2/2011 | | H01L 21/02381 |
| EP | 2290710 A1 | 3/2011 | | |
| JP | 2000-036466 A | 2/2000 | | |
| JP | 2003-293070 A | 10/2003 | | |
| JP | 2006-278368 A | 10/2006 | | |
| JP | 2008-169060 A | 7/2008 | | |
| JP | 2009-221083 A | 10/2009 | | |
| JP | 2009-542560 A | 12/2009 | | |
| JP | 2010-062482 A | 3/2010 | | |
| JP | 2010-515651 A | 5/2010 | | |
| JP | 2010-534612 A | 11/2010 | | |
| JP | 2012-77345 A | 4/2012 | | |
| KR | 20100126103 A | 12/2010 | | |
| TW | 201020206 A | 6/2010 | | |
| WO | 02/44444 A1 | 6/2002 | | |
| WO | WO 2004004927 A2 * | 1/2004 | | B82Y 10/00 |
| WO | 2006/126330 A1 | 11/2006 | | |
| WO | WO 2007102781 A1 * | 9/2007 | | B82Y 30/00 |
| WO | 2008/048704 A2 | 4/2008 | | |
| WO | WO 2008085129 A1 * | 7/2008 | | B82Y 10/00 |
| WO | 2009072631 A1 | 6/2009 | | |
| WO | 2010/022064 A1 | 2/2010 | | |
| WO | 2011/040012 A1 | 4/2011 | | |
| WO | 2011/162715 A1 | 12/2011 | | |
| WO | 2011/0162715 A9 | 12/2011 | | |
| WO | 2012/043885 A1 | 4/2012 | | |
| WO | 201213665 A1 | 10/2012 | | |

OTHER PUBLICATIONS

French Search Report dated Jul. 10, 2013 issued in corresponding application No. FR1260208; with English partial translation and partial machine translation.
International Search Report dated Jun. 2, 2014 issued in co-pending application No. PCT/EP2013/072426.
French Search Report dated Jul. 30, 2013 issued in application No. FR1260209 corresponding to co-pending application No. PCT/EP2013/072426; with English translation.
Oliver et al., "Organometallic vapor phase epitaxial growth of GaN on ZrN/AlN/Si substrates", Applied Physics Letters, vol. 93, 023109, 2008, 3 pages (in English); cited in the French Search Report of FR1260209.corresponding to co-pending PCT/EP2013/072426.

Office Action dated May 18, 2015 issued in co-pending U.S. Appl. No. 14/064,916 (13 pages) (WO2011/162715 cited in the Office Action is not listed in this IDS since it was already listed in a previous IDS).
Sang et al., "Structural and stimulated emission characteristics of diameter-controlled ZnO nanowires using buffer structure", J. Phys. D: Appl. Phys. 42 (2009) 225403 (pp. 1-6), Oct. 29, 2009.
Search Report issued by STIC Database Tracking No. 483674— "Re: For Process for Growing at Least One Nanawire Using a Transition Metal Nitride Layer Obtained in two Steps", dated Apr. 27, 2015; in co-pending U.S. Appl. No. 14/064,858 (8 pages).
Kuang-Wei et al.. "InN nanorods prepared with CrN nanoislands by plasma-assisted molecular beam epitaxy", Nanoscale Research Letters, 2011, pp. 1-6; in co-pending U.S. Appl. No. 14/064,858.
Liu et al., "Growth of InN nanorods prepared by plasma-assisted molecular beam epitaxy with varying Cr thicknesses", Journal of Crystal Growth, vol. 347, 2012, pp. 113-118; in co-pending U.S. Appl. No. 14/064,858.
Office Action dated Nov. 30, 2015 issued in co-pending U.S. Appl. No. 14/064,858 (9 pages).
Office Action dated Oct. 6, 2015 issued in co-pending U.S. Appl. No. 14/064,916 (12 pages).
Advisory Action and Interview Summary dated Feb. 11, 2016 issued in co-pending U.S. Appl. No. 14/064,916 (8 pages).
Office Action dated Nov. 9, 2015 issued in co-pending U.S. Appl. No. 14/438,497 (6 pages).
Final Office Action dated Nov. 18, 2016 in co-pending U.S. Appl. No. 14/064,916 (without returned SB08, 5 pages).
International Search Report and Written Opinion dated Jan. 17, 2014 in counterpart PCT Application No. PCT/EP2013/072448 of co-pending U.S. Appl. No. 14/438,188 (in English; ISR in co-pending U.S. Appl. No. 14/438,188; 17 pages).
International Preliminary Report on Patentability dated Apr. 28, 2015 in counterpart PCT Application No. PCT/EP2013/072448 of co-pending U.S. Appl. No. 14/438,188 (in English; ISR in co-pending U.S. Appl. No. 14/438,188; 13 pages).
Chen, X. et al., "Homoepitaxial growth of catalyst-free GaN wires on N-polar substrates", Applied Physics Letters, AIP, American Insitute of Physics, Melville, NY, US, vol. 97, No. 15, Oct. 13, 2010 (in English; in co-pending U.S. Appl. No. 14/438,188; 3 pages).
Song, K. et al., "Selective area growth of GaN nanowires using metalorganic chemical vapor deposition on nano-patterned Si (111) formed by the etching of nano-sized Au droplets", Thin Solid Films, 520(1 ), (2011) 126-130 (in English; in co-pending U.S. Appl. No. 14/438,188).
Noborisaka, J. et al., "Catalyst-free growth of GaAs nanowires by selective-area metalorganic vapor-phase epitaxy", Applied Physics Letters 86 (2005), 213102 (in English; in co-pending U.S. Appl. No. 14/438,188; 3 pages).
Office Action dated Mar. 30, 2016 issued in co-pending U.S. Appl. No. 14/438,188 (with PTO892, without SB08, 9 pages).
Notice of Allowance dated Aug. 24, 2016 in co-pending U.S. Appl. No. 14/438,188 (7 pages).
International Written Opinion dated Jun. 5, 2014 issued in application No. PCT/EP2013/072424 corresponding to co-pending U.S. Appl. No. 14/438,480 (with English translation; 31 pages).
International Written Opinion dated Jun. 2, 2014 issued in application No. PCT/EP2013/072426 corresponding to co-pending U.S. Appl. No. 14/438,497 (with English translation; 33 pages).
Office Action dated Apr. 8, 2016 issued in co-pending U.S. Appl. No. 14/064,916 (with PTO892, without PTO1449, 11 pages).
Office Action dated Jul. 29, 2016 issued in co-pending U.S. Appl. No. 14/064,858 (without SB08, 8 pages) (US20130221322 to Ohlsson and US20100124025 to Yamaguchi et al. cited in the Office Action are not listed in this IDS since they were listed in a previous IDS filed on Mar. 29, 2016).
Office Action dated Aug. 4, 2016 issued in co-pending U.S. Appl. No. 14/438,397 (without SB08, 9 pages) (US20100096614A1 to Kim et al. cited in the Office Action is not listed in this IDS since it was listed in a previous IDS filed on Mar. 4, 2016.
Non-final Office Action dated Feb. 27, 2017 in co-pending U.S. Appl. No. 14/438,497 (without returned SB08, 11 pages).

(56) References Cited

OTHER PUBLICATIONS

Notice of Allowance dated Mar. 10, 2017 in co-pending U.S. Appl. No. 14/064,916 (without returned SB08, 10 pages).

Japanese Office Action and search report dated Aug. 1, 2017 in corresponding Japanese application No. 2015-538470 (with English machine translation; 28 pages) (D1 Sang et al., J. Phys. D: Appl. Phys. 42 (2009) 225403 (pp. 1-6), D5 20110127490, and D6 WO2011/162715, are not listed in this IDS since they were already listed in the IDS filed Jul. 22, 2015, and Apr. 24, 2015, respectively).

English translation of Japanese Office Action dated Aug. 1, 2017 in corresponding Japanese application No. 2015-538470 (3 pages).

Japanese Office Action and search report dated Jul. 4, 2017 in Japanese application No. 2015-538536 corresponding to co-pending U.S. Appl. No. 14/438,188 (now U.S. Pat. No. 9,537,044) (with English machine translation; 58 pages) (D5 WO2012/136655 and D8 US 20120068153 cited in the Japanese Office Action are not listed in this IDS since they were already listed in the IDS filed Oct. 3, 2016 and Apr. 24, 2015, respectively).

Chinese Office Action and search report dated Jul. 5, 2017 in chinese application No. 201380056223.3 corresponding to co-pending U.S. Appl. No. 14/438,188 (now U.S. Pat. No. 9,537,044) (with English machine translation; 15 pages).

Chinese Office Action and search report dated Feb. 24, 2017 in Chinese application No. 201380063090.2 corresponding to co-pending U.S. Appl. No. 14/438,497 (with English machine translation; 13 pages) (US20100096614 cited in the Chinese Office Action, and U.S. Pat. No. 6,297,063 and US20040004242 cited in the search report are not listed in this IDS since they were already listed in the IDS filed Apr. 24, 2015, Feb. 24, 2016, and Oct. 3, 2016, respectively).

* cited by examiner

PROCESS FOR GROWING AT LEAST ONE NANOWIRE USING A TRANSITION METAL NITRIDE LAYER OBTAINED IN TWO STEPS

TECHNICAL FIELD OF THE INVENTION

The invention relates to the field of semiconductor materials and more precisely that of the growth of semiconductor nanowires.

The invention relates more particularly to a process for growing at least one nanowire.

PRIOR ART

In the field of nanowire growth, it is known practice to use nucleation layers such as AlN (aluminum nitride) or TiN (titanium nitride). These layers may be deposited directly by LPCVD (low-pressure chemical vapor deposition) or by APCVD (atmospheric-pressure chemical vapor deposition) as described in document WO 2011/162715.

This document WO 2011/162715 states that semiconductor nanowires have a growth that may be promoted if the crystallographic orientation of a crystalline substrate enabling the growth is oriented in the direction [111] in a "face-centered cubic structure of NaCl type", or along the axis "c" in a "hexagonal" structure.

If the substrate is not correctly oriented, it is possible to deposit an AlN or TiN nucleation layer whose crystallographic structure will have a predominance of orientation in the direction [0001] for AlN which has a hexagonal structure and in the direction [111] for TiN which has a face-centred cubic structure (fcc) structure.

It results from the foregoing that the crystallographic orientation of the growth support for nanowires is important. The predominance in a correct direction of a crystallographic structure should thus be optimized in order to promote the growth of the nanowires from this crystallographic structure.

OBJECT OF THE INVENTION

The aim of the present invention is to propose a solution for improving the crystallographic orientation of a nucleation layer of one or more nanowires.

Steps toward this aim are taken by a process for growing at least one semiconductor nanowire, said growth process comprising a step of forming, on a substrate, a nucleation layer for the growth of the nanowire and a step of growth of the nanowire, in particular the step of forming the nucleation layer comprises the following steps: deposition on the substrate of a layer of a transition metal chosen from Ti, V, Cr, Zr, Nb, Mo, Hf, Ta; nitridation of at least part of the transition metal layer so as to form a layer of transition metal nitride having a surface intended for the growth of the nanowire.

Advantageously, the nitridation step of said transition metal layer is performed so as to at least partly modify the crystallographic structure of the transition metal layer toward a face-centered cubic crystallographic structure, which is especially oriented [111], or hexagonal crystallographic structure, which is especially oriented [0001] or along the direction of the axis "C", associated with the transition metal nitride layer.

According to a particular implementation, the nitridation step comprises: a first nitridation substep at least partly performed at a first temperature by imposing an injection of a nitridation gas at a first flow rate; a second nitridation substep at least partly performed at a second temperature less than or equal to the first temperature by imposing an injection of the nitridation gas at a second flow rate which may or may not be different from the first flow rate. For example, the injected nitridation gas is ammonia, and: the first temperature is between 1000° C. and 1050° C., especially equal to 1050° C.; the first flow rate is between 500*V/8 sccm and 2500*V/8 sccm, especially equal to 1600*V/8 sccm; the second temperature is between 950° C. and 1050° C., especially equal to 1000° C.; the second flow rate is between 500*V/8 sccm and 2500*V/8 sccm, especially equal to 480*V/8 sccm; and in which V is the total capacity in liters of a corresponding nitridation chamber.

Alternatively, the nitridation step comprises a first nitridation substep at least partly performed at a first temperature by imposing an injection of a nitridation gas at a first flow rate; a second nitridation substep at least partly performed at a second temperature greater than or equal to the first temperature by imposing an injection of the nitridation gas at a second flow rate which may or may not be different from the first flow rate.

In general, it may be considered that the first temperature may be less than or greater than or equal to the second temperature, and preferably less than or greater than the second temperature.

According to one implementation, the nitridation step is performed in a nitridation chamber placed at a pressure of between 50 mbar and 800 mbar, especially 100 mbar.

As an example, the nanowire growth step is performed after the second nitridation substep, or is initiated during the second nitridation substep.

Preferably, the nanowire growth step comprises a step of injecting Ga so as to form the gallium nitride nanowire, said nanowire extending from the growth surface of the nucleation layer.

Advantageously, with the substrate being silicon, the step of depositing the transition metal layer is configured such that the interdiffusion of silicon into the deposited transition metal layer is less than 10 nm and/or so as to conserve a non-silicidized slice of the transition metal layer of at least 2 nm.

In the case where the deposited transition metal is chosen from Cr, V or Ti, said transition metal is deposited at a temperature below 100° C.

Advantageously, the substrate being based on silicon, the step of depositing the transition metal layer comprises a preliminary step of determining the thickness of the transition metal layer to be deposited, comprising: a step of determining a first diffusion length of the silicon into the transition metal layer during the future deposition of the transition metal layer as a function of the transition metal used and of the deposition temperature; a step of determining a second diffusion length of the silicon into the transition metal layer during the future nitridation step of the transition metal layer; said thickness of the transition metal layer to be deposited being dependent on the desired thickness of the transition metal nitride layer and on a thickness of a silicidized slice of transition metal obtained in the future transition metal layer from the first and second determined diffusion lengths.

According to one implementation of the growth process, said process comprises a step in which the substrate is envisioned such that it has a resistivity of between 1 mΩ·cm and 100 mΩ·cm.

Advantageously, the growth process comprises, before deposition of the transition metal layer, a step of deoxidation of a surface of the substrate intended to receive the transition metal layer.

In addition, the step of depositing said transition metal layer and the nitridation step are preferably implemented before the growth step.

The invention also relates to a process for manufacturing an optoelectronic device, said process comprising: a step of performing the growth process; the electrical doping of a first type of at least one end of the nanowire which is opposite the substrate; the formation of an electrically doped element of a second type opposite the first type at the end of the nanowire opposite the substrate. In addition, such a process may also comprise a step of forming quantum wells placed at the interface between the nanowire and the electrically doped element of the second type.

SUMMARY DESCRIPTION OF THE DRAWINGS

Figure 2:
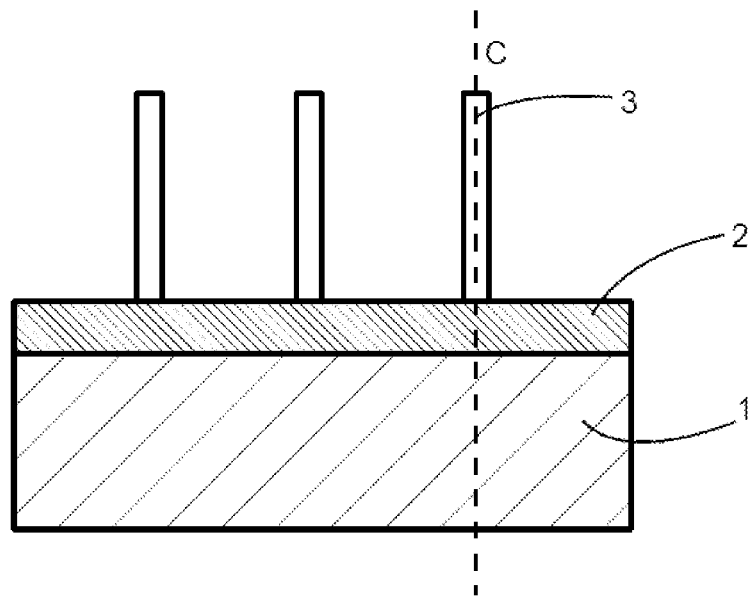
Figure 3:
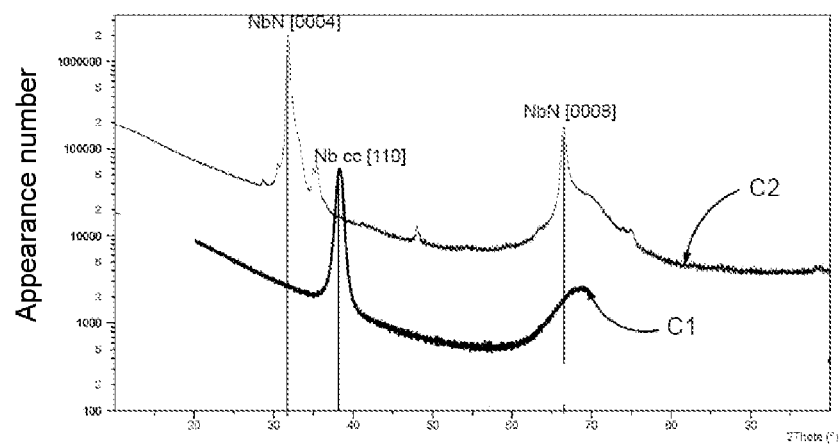
Figure 4:
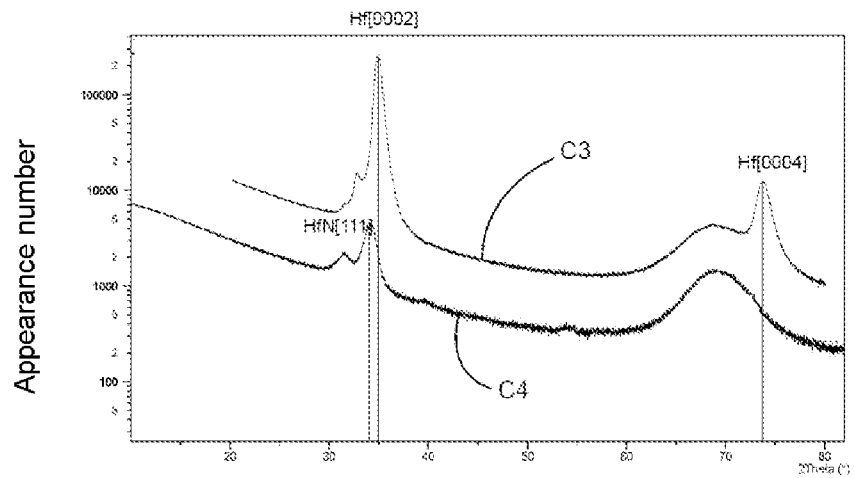
Figure 5:
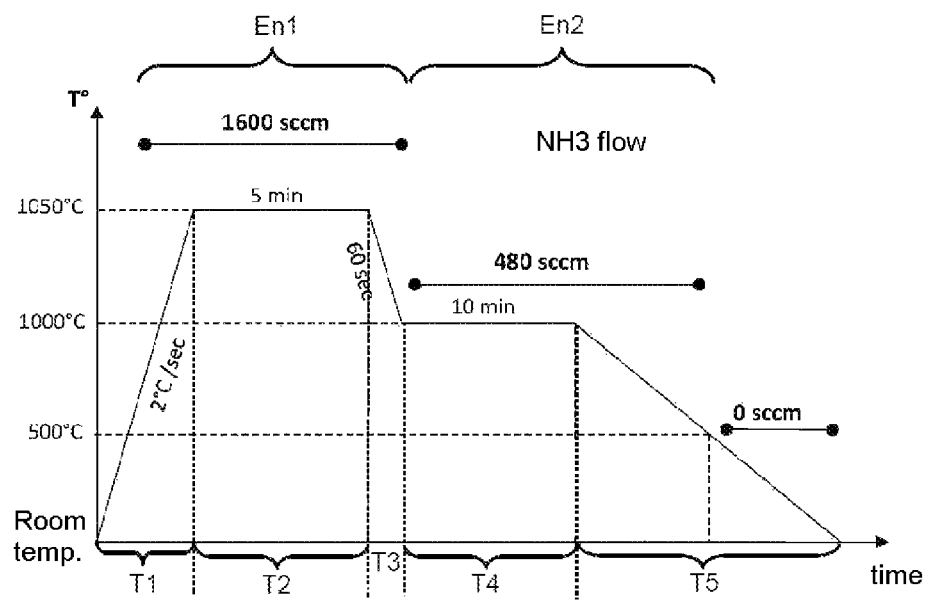
Figure 6:
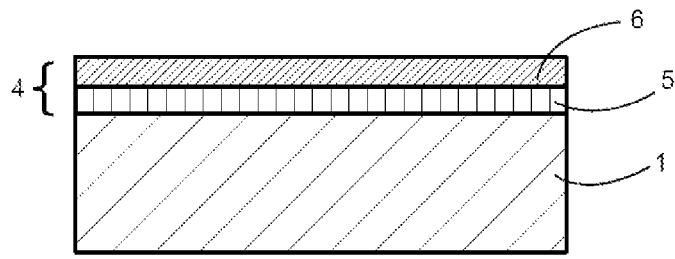
Figure 7:
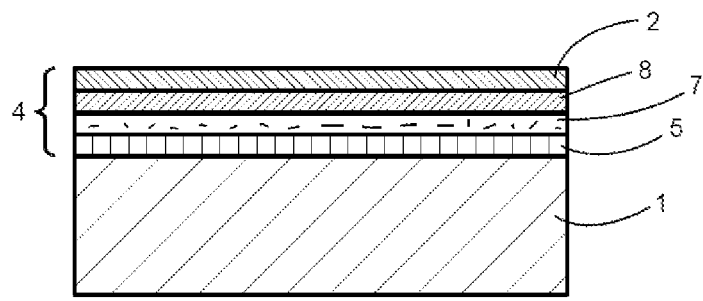
Figure 8:
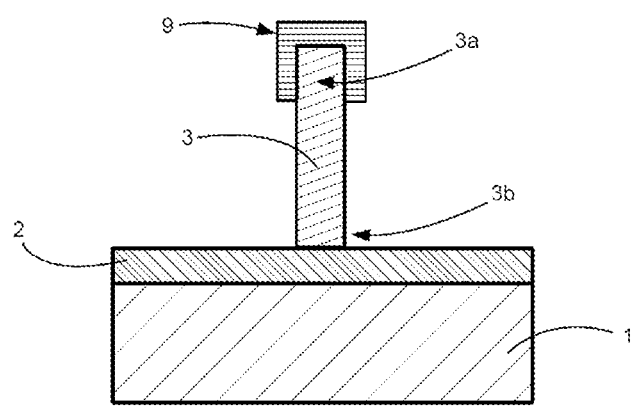
Figure 9:
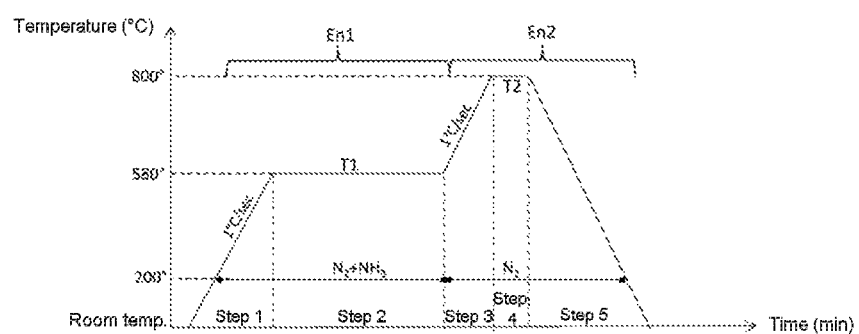

Other advantages and characteristics will emerge more clearly from the description which follows of particular embodiments of the invention, which are given as nonlimiting examples and represented on the attached drawings, in which:

FIG. 1 is a view in cross section of a step of formation of a nucleation layer,

FIG. 2 is a view in cross section of a step of nucleation of at least one nanowire from the nucleation layer, FIG. 3 illustrates a representation of the X-ray diffraction spectrum for identifying the types of crystallographic structures present in an Nb-based transition metal layer before nitridation and after nitridation, FIG. 4 illustrates a representation of the X-ray diffraction spectrum for identifying the types of crystallographic structures present in an Hf-based transition metal layer before nitridation and after nitridation, FIG. 5 represents in detail an implementation of a nitridation step according to one embodiment of the invention, FIGS. 6 and 7 illustrate different steps for preparing a nucleation layer, FIG. 8 illustrates a particular embodiment of a process for manufacturing an optoelectronic device, FIG. 9 illustrates in detail another implementation of a nitridation step according to one embodiment of the invention.

DESCRIPTION OF PREFERENTIAL MODES OF THE INVENTION

The process described below differs from the prior art especially in that the nucleation layer is prepared in two steps, first deposition of a transition metal, followed by at least partial nitridation of this transition metal. This particular sequence of steps makes it possible to give the nucleation layer a better surface intended for growing the nanowires.

The term "microwire" or "nanowire" in the rest of the description preferentially means a three-dimensional structure of elongated shape whose longitudinal dimension is at least equal to once the transverse dimension(s), preferably at least five times and even more preferentially at least ten times. The transverse dimension(s) are between 5 nm and 2.5 μm. In certain embodiments, the transverse dimensions may be less than or equal to about 1 μm, preferably between 100 nm and 300 nm. In certain embodiments, the height of each nanowire may be greater than or equal to 500 nm, preferably between 1 μm and 50 μm.

As illustrated in FIG. 1, the process for growing at least one semiconductor nanowire comprises a step of forming, on a substrate 1, a nucleation layer 2 for the growth of the nanowire and a step of growth of the nanowire 3 (FIG. 2). Needless to say, the step of growth of the nanowire 3 enables the latter to grow from the nucleation layer 2.

An example has been given based on the growth of a nanowire, but the growth process is not limited to this sole example and makes it possible, during the growth step, to grow a plurality of nanowires side by side using the nucleation layer 2.

It is understood from the foregoing that the prime function of the nucleation layer 2 is to promote the nucleation of the nanowire(s) 3. In addition, this nucleation layer 2 is preferably chosen so as to protect the substrate 1 from any degradation during the growth (which may be the case if the substrate is made of silicon and the nanowire made of gallium nitride), and/or to conserve good stability at high temperatures (in the case of temperatures above 500° C.), and/or to give good electrical conduction especially when it is desired to polarize each nanowire 3 and to inject current via the substrate 1.

As regards the substrate 1, the process may, in a nonlimiting manner, comprise a step in which the substrate is provided such that it has a resistivity of between 1 mΩ·cm and 100 mΩ·cm. This resistivity is advantageous when it is desired to polarize the nanowires as indicated above across the nucleation layer 2.

To begin with, it should be noted that a nucleation layer 2 makes it possible to promote the growth of one or more nanowires 3 when these wires grow from this nucleation layer 2 in the vast majority substantially perpendicular to the substrate 1 (axis C represented in FIG. 2). The term "substantially perpendicular to" means exactly perpendicular or perpendicular to more or less 10°. This slight disorientation of more or less 10° nevertheless permits the performance of subsequent technological steps for preparing more complete devices.

It will thus be sought to have, in the nucleation layer, a crystallographic orientation adapted to the growth of the nanowires 3. Moreover, if this crystallographic orientation is dense, i.e. predominant, the density of these nanowires 3 can then be magnified.

For this, the step of formation of the nucleation layer comprises a step of deposition onto the substrate 1 of a layer of a transition metal 4 chosen from Ti (titanium), V (vanadium), Cr (chromium), Zr (zirconium), Nb (niobium), Mo (molybdenum), Hf (hafnium) and Ta (tantalum), followed by a step of nitridation of at least part of the transition metal layer so as to form a layer of transition metal nitride (titanium nitride, vanadium nitride, chromium nitride, zirconium nitride, niobium nitride, molybdenum nitride, hafnium nitride or tantalum nitride, respectively, as a function of the initial transition metal layer deposited) having a surface intended for growing the nanowire(s) 3. In order to optimize the growth, this transition metal nitride layer may have a minimum thickness of 2 nm and preferably between 2 nm and 50 nm.

According to one embodiment, the deposition of the transition metal layer is performed at a temperature between room temperature and 400° C. Beyond this temperature, there is a risk of lowering of the nanowire growth yield.

According to one implementation applicable to the different transition metals, especially for Hf, Nb and Ta, the deposited transition metal layer may have a thickness of between 20 nm and a few hundred nanometers (for example 200 nm). For the other transition metals, a thickness of nm will be preferred. The deposition may be performed by PVD (physical vapor deposition) from a metal target, for example a continuous-current spray passing over the target. During this step of deposition of the transition metal, the substrate 1 may be maintained at room temperature. In a general manner applicable throughout the description, the term "room temperature" means a temperature preferably between 20° C. and 50° C. The pressure in the PVD chamber during the deposition of the transition metal may be between $3 \times 10^{-3}$ mbar and $6 \times 10^{-3}$ mbar.

After various tests, it was possible to observe that the growth of nanowire(s) was promoted by this nucleation layer 2 formed in two steps.

In point of fact, it turns out that the transition metal nitride layer thus formed has growth sites whose crystallographic orientation is more favorable to the growth of nanowires. These growth sites are in greater number and have a better distribution than in the prior art, especially by comparing a titanium nitride nucleation layer prepared according to the process of the invention relative to the titanium nitride layer deposited in a single step of the prior art. In addition, this makes it possible to avoid any formation of a metal-gallium alloy during the growth of gallium-based nanowires. Thus, it is understood that, advantageously, the step of deposition of the said transition metal layer and the nitridation step are performed before the nanowire growth step.

Furthermore, the fact of choosing one of the following transition metals: Ti, V, Cr, Zr, Nb, Mo, Hf, Ta, to form, after nitridation of the said transition metal, the nucleation layer 2 makes it possible to combine electrical conduction characteristics of metallic type and the refractory nature of a ceramic. These properties, which are in principle antagonist, may be achieved by the transition metals mentioned above. In point of fact, the refractory nature may be achieved by a material whose melting point is associated with a temperature above about 1800° C., which is the case for the transition metal nitrides targeted above. Tungsten, although present in the same column as chromium and molybdenum, is set aside from the list since tungsten nitride has insufficient stability properties at high temperatures, which does not allow efficient growth of the nanowires.

The transition metal nitride layer thus obtained also makes it possible, by virtue of the transition metal used, to have a smaller gap than the AlN-based nucleation layers that have been very commonly used to date as nucleation layer. Thus, when the substrate 1 is based on silicon, the nucleation layer 2 according to the invention has at its interface with the substrate a potential barrier that is easier to cross than in the case where AlN is used, this giving an advantage when it is desired to polarize one or more nanowires from the substrate 1.

It results from the foregoing that the crystallographic orientation of the nucleation layer 2, especially on a surface intended for growing the nanowire(s), is of importance in the context of promoting the growth of nanowire(s). Thus, the step of deposition of the transition metal layer is preferentially performed such that said transition metal layer has, before the nitridation step, at least partly a crystallographic structure of centered cubic (CC) or of hexagonal (these two crystallographic structures are those of the metals mentioned above).

In the present description, when predominance of a crystallographic structure is mentioned, this means that said structure appears in greater proportion than each of the other crystallographic structures taken independently.

Typically, for the transition metals targeted above, the cubic-centered (CC) structure may be obtained naturally by depositing a layer of a transition metal chosen from Cr, Mo, V, Nb, Ta, and the hexagonal structure may be obtained naturally by depositing a layer of a transition metal chosen from Ti, Zr, Hf.

The specific crystallographic structures targeted previously make it possible to perform the step of nitridation of said transition metal layer or at least part of the transition metal layer so as to at least partly modify the crystallographic structure of the transition metal layer toward a face-centered cubic structure, which is especially oriented [111], or hexagonal crystallographic structure, which is especially oriented [0001] or along the direction of the axis "C", associated with the transition metal nitride layer.

FIGS. 3 and 4 each illustrate an X-ray diffraction spectrum for identifying the crystallographic phases or structures present. FIG. 3 shows that for the curve C1 representing the crystallographic structure of the layer of transition metal of Nb type before nitridation, there is indeed a predominance of the orientation [110] of the centered cubic (cc) structure of Nb, and that for the curve C2 representative of the hexagonal crystallographic structure of the transition metal nitride layer NbN, there is indeed a predominance of the orientation [0004] of the hexagonal structure and of its orientation harmonic [0008], i.e. of similar orientation to [0001]. FIG. 4 shows that for the curve C3 representative of the hexagonal crystallographic structure of the transition metal layer of Hf type before nitridation, there is indeed a predominance of the orientation [0002] of the hexagonal structure, and that for the curve C4 representative of the face-centered cubic crystallographic structure of the transition metal nitride layer HfN, there is indeed a predominance of the orientation [111] of the face-centered cubic structure. On FIGS. 3 and 4, only the peaks are important for visualizing the predominance, the rest of the curve representing a continuous background due to the experimental device and the sample. Similar curves may be produced by a person skilled in the art for the other transition metals and the conclusions would be substantially identical, for example for tantalum nitride, there would be a predominance of the orientation [111] of the face-centered cubic structure of tantalum nitride.

According to a particular implementation, especially illustrated in FIG. 5, the nitridation step may comprise a first substep of nitridation En1 performed at least partly at a first temperature by imposing an injection of a nitridation gas at a first flow rate, and a second substep of nitridation En2 performed at least partly at a second temperature less than or equal to the first temperature by imposing an injection of the nitridation gas at a second flow rate, which may or may not be different (i.e. the first flow rate may be equal to the second flow rate), from the first flow rate. This makes it possible to optimize the crystallographic orientation of the nucleation layer. It goes without saying that these two nitridation substeps are performed one after the other. In particular, the first substep En1 makes it possible to perform a rapid nitridation and the second substep En2 makes it possible to perform annealing which stabilizes the nitride phase of the transition metal. Following these two substeps En1 and En2, the transition metal nitride layer is chemically and thermally stable and can act as protection for the substrate (in particular if this substrate is made of silicon) during the growth of the nanowire(s).

The injected gas may be ammonia $NH_3$ or dinitrogen $N_2$. $NH_3$ is preferred since it makes it possible to nitride the transition metal layer more rapidly. In point of fact, in the NH$_3$ form, the nitriding power is greater than for N$_2$. This rapid nitridation may be important especially if the transition metal is capable of being transformed into silicide: this point is addressed hereinbelow.

According to a particular example, the injected nitridation gas being ammonia, the first temperature is between 1000° C. and 1050° C., especially equal to 1050° C., the first flow rate is between 500 sccm and 2500 sccm (sccm means "standard cubic centimeters per minute"), especially equal to 1600 sccm, the second temperature is between 950° C. and 1050° C., especially equal to 1000° C., the second flow rate is between 500 sccm and 2500 sccm, especially equal to 500 sccm.

The flow rates mentioned above correspond to the volume capacity of the nitridation chamber used, i.e. a total volume of gas (for example N$_2$+NH$_3$) of 8 liters in the example mentioned. For a chamber of a different volume, the flow rates must be adapted (for example: for an 18-liter chamber, the first flow rate will especially have to be equal to 4000 sccm and the second flow rate especially equal to 1200 sccm). In other words, the first flow rate is between 500*V/8 sccm and 2500*V/8 sccm, especially equal to 1600*V/8 sccm, and the second flow rate is between 500*V/8 sccm and 2500*V/8 sccm, especially equal to 500*V/8 sccm. V is the total capacity in liters of a corresponding nitridation chamber. The term "corresponding nitridation chamber" means herein the chamber in which the nitridation of the transition metal layer is performed.

In general, the nitridation step may be performed in a nitridation chamber placed at a pressure of between 50 mbar and 800 mbar, especially 100 mbar.

FIG. 5 illustrates in a detailed manner the nitridation step by representing the change in temperature as a function of the time in a nitridation chamber. In a first time T1, the temperature in the nitridation chamber rises gradually, for example at 2° C./s up to a 1050° C. stage. The first nitridation substep under NH$_3$ En1 targeted above begins when the temperature reaches 200° C. During this first substep, the NH$_3$ flow rate remains constant at 1600 sccm. In a second time T2, concomitant with at least part of the first substep, the temperature is maintained at 1050° C. for a time of between 5 minutes and 15 minutes. In a third time T3, the first substep En1 is continued while the temperature passes from 1050° C. to 1000° C. in 60 s. In a fourth time T4, the temperature in the nitridation chamber is maintained at 1000° C. for a time of between 5 minutes and 15 minutes and the second substep En2 is started. In a fifth time T5, the introduction of heat into the nitridation chamber is stopped so that the temperature of the nitridation chamber falls until it returns to room temperature. The duration of T5 may correspond to the inertia of the nitridation chamber. The second nitridation substep En2 may be continued for a given time during the fifth time T5. The fifth time T5 may correspond to stoppage of the heating of the chamber and then to its decrease in temperature or may also correspond to a step of growth of the nanowires if the chamber used for the nitridation is also the MOCVD chamber dedicated to the synthesis of the nanowires. According to a particular implementation, the step of growth of the nanowire 3 is performed after the second nitridation substep En2, or is initiated during the second nitridation substep En2.

In general, the step of growth of said at least one nanowire 3 may comprise a step of injecting a material intended at least partly to form the nanowire 3. In particular, this will be an injection of Ga so as to form the gallium nitride nanowire 3, said nanowire 3 extending from the growth surface of the nucleation layer 2. To form the gallium nitride nanowire, the injection of Ga may be performed concomitantly with an injection of NH$_3$ or N$_2$. In general, for the synthesis of GaN, it is the reaction of Ga with NH$_3$ and not with N$_2$ that is used. The injection of Ga may be performed in a chamber adapted to the growth of nanowires.

The use of gallium nitride to form said at least one nanowire 3 provides at least two advantages.

A first advantage is that the face-centered cubic or hexagonal structures of the transition metal nitride layer (and thus of the nucleation layer 2) are favorable to epitaxy of gallium nitride. Nanowires made of gallium nitride, the crystallographic structure of which is a hexagonal structure of the wurtzite type oriented along the axis C (or along the axis [0001]) of FIG. 2, may be readily nucleated from the nucleation layer 2 as described. Alternatively, the nanowires may also be made of ZnO, InN or SiC.

A second advantage is that gallium nitride is a good candidate with a view of forming an electrooptic device. Specifically, such a nanowire 2 made of gallium nitride makes it possible to form a light nanoemitter. GaN-based quantum wells may be added either in shell form around the nanowire, or in the continuity of the axis of the nanowire (axial structure). Depending on the composition of these GaN-based quantum wells, the spectral domain of the light emission may cover a wide wavelength range extending from ultraviolet to infrared.

In order to achieve optimized nanowire growth, it is preferable for the transition metal layer to be sparingly silicidized/silicide formed. Silication of the transition metal layer may arise, if the substrate 1 is based on silicon, according to two cases: during the step of deposition of the transition metal, and/or when it is desired to nitride the deposited transition metal layer to delimit the nucleation layer 2.

The first case may be explained in the following manner. In point of fact, at high temperature (about 1000° C.), the formation of silicide compounds MSi$_2$ is promoted (M being the transition metal used). Among these silicides, only silicides of transition metals from column V (VSi$_2$, NbSi$_2$, TaSi$_2$), plus chromium silicide (CrSi$_2$) form crystallographic phases of hexagonal structure, which are potentially advantageous (if textured along the axis c) for the growth of GaN nanowires. However, the disagreement in lattice parameter "a" between these hexagonal phases and GaN (3.19 Å) is so large, respectively −30%, −36%, −33% and −25% for VSi$_2$, NbSi$_2$, TaSi$_2$ and CrSi$_2$, that epitaxy of GaN is highly improbable. Typically, the lattice parameter "a" for the hexagonal compounds VSi$_2$, NbSi$_2$, TaSi$_2$ and CrSi$_2$ is, respectively: 4.57 Å, 4.97 Å, 4.78 Å and 4.28 Å. Thus, a subfamily may be formed from the following materials: Ti, V, Cr, Nb, Ta, Mo, i.e. metals for which the interdiffusion coefficient with Si is high, which implies rapid growth kinetics of the new MSi$_2$ phase. By way of example, Cr has a coefficient of interdiffusion with Si at 850° C. of 1.5×10−7 cm$^2$/s, i.e. a diffusion length of about 11.6 μm in 15 minutes, whereas at about 100° C., this diffusion length falls to about 80 nm in 15 minutes. For the reasons mentioned above, if the deposited transition metal is chosen from Cr, V and Ti, it is preferentially deposited at a temperature below 100° C. so as to limit the diffusion of the silicon derived from the substrate. For Nb, the Nb—Si interdiffusion length over 15 minutes is 12 nm and 2 nm, for 800° C. and 700° C., respectively. Nb may thus be deposited at high temperature up to 700-750° C. without—or with very little—silicidation. The other materials: Zr, Hf and Ta having smaller coefficients of interdiffusion with Si than Nb, may thus be readily deposited from room temperature up to 750° C.-800° C. at most. Excessive silication would have the consequence of not making it possible later to obtain a transition metal nitride layer of sufficient thickness. In other words, to generalize, when the substrate is silicon, the step of deposition of the transition metal layer is configured such that the interdiffusion of silicon into the deposited transition metal layer is less than 10 nm and/or so as to conserve a non-silicidized slice of the transition metal layer of at least 2 nm. In point of fact, this non-silicidized slice is opposite the substrate and is intended to form the nitride layer of the transition metal.

In FIG. 6, reference 4 indicates the transition metal layer initially deposited on the substrate 1, during the deposition of the layer 4, a slice of this layer may be silicidized such that only part 6 of the layer 4 is composed of the pure transition metal that can serve to form, by nitridation, the nucleation layer.

In the second case, the nitridation step may make it necessary to work at 1050° C. for a few minutes. To do this, use will preferably be made as nitriding gas of $NH_3$, since, by virtue of its high nitriding power, the nitridation reaction rate is higher than the silication reaction rate. In point of fact, in the ideal case, it is sought to form (FIG. 7) during the nitridation step at least one transition metal nitride layer 2 (i.e. the nucleation layer) in the deposited transition metal layer 4, the thickness of said transition metal nitride layer advantageously being between 2 nm and 50 nm. In order to avoid the production of a large amount of a new silicide compound in the region of this transition metal nitride layer, the nitridation step will be optimized. In point of fact, after the nitridation step, it is understood, as illustrated in FIG. 7, that the layer 4 that it was sought to produce by depositing a transition metal may actually comprise a first transition metal silicide layer 5 obtained during the deposition of said transition metal, a second transition metal silicide layer 7 placed in the continuity of the first transition metal silicide layer 5 obtained during the nitridation step and the nucleation layer 2 derived from the nitridation of the layer 6 of FIG. 6. Optionally, it is also possible that a residual layer 8 of pure transition metal remains intercalated between layer 2 and layer 7, this depending partly on the initially deposited thickness of the transition metal layer.

It results from the explanation of the first and second cases that if the substrate 1 is made of silicon, a person skilled in the art will be capable of determining the thickness of the transition metal layer which is sought to be deposited as a function of the type of transition metal to be deposited, of the temperature of deposition of the transition metal, of the duration of the transition metal deposition, and also of the duration of the nitridation step so that it is possible to obtain a layer of transition metal nitride of a predetermined thickness. In other words, for a substrate based on silicon, the step of deposition of the transition metal layer 4 may comprise a preliminary step of determining the thickness of the transition metal layer 4 to be deposited, said step of determining the thickness comprising: a step of determining a first diffusion length of silicon into the transition metal layer 4 during the future deposition of the transition metal layer as a function of the transition metal used and of the deposition temperature; a step of determining a second diffusion length of silicon into the transition metal layer 4 during the future step of nitridation of the transition metal layer 4. Said thickness of the transition metal layer 4 to be deposited being a function of the desired thickness of the transition metal nitride layer and of a thickness of a silicidized slice of transition metal obtained in the future transition metal layer 4 from the first and second determined diffusion lengths.

In general, the substrate 1 will advantageously be prepared before the deposition of the transition metal layer 4. To do this, the process may comprise, before the step of deposition of the transition metal layer, a step of deoxidation of a surface of the substrate 1 intended to receive the deposit of the transition metal layer 4. More particularly, this step of deoxidation of the surface of the silicon may be performed either chemically (HF bath) or physically (etching of the surface by applying a bias tension to the substrate 1). This makes it possible especially to remove the layer of native silicon oxide ($SiO_2$) which is an "insulating" barrier to the injection of electrons into the nucleation layer and into the gallium nitride nanowire.

Preferentially, the growth process described above may be used in the context of forming an optoelectronic device.

Thus, the invention may also relate to a process for manufacturing an optoelectronic device (FIG. 8). Such a manufacturing process comprises a step of implementing the growth process as has been described above, especially in its various implementations or embodiments. Moreover, the manufacturing process also comprises a step of electrical doping of a first type of at least one end 3a of the nanowire 3 opposite the substrate 1. This first type is, preferably, doping of n type. In addition, the process also comprises a step of forming an electrically doped element 9 of a second type opposite the first type at the end 3a of the nanowire 3 opposite the substrate 1. This second type of doping is preferentially of p type. Thus, the end 3a of the nanowire 3 and the doped element 9 associated with this end 3a may form a junction of a diode intended to emit light. This junction is preferably a homojunction, i.e. the nanowire 3 and the associated doped element 9 are based on the same materials, for instance gallium nitride. The preparation of a heterojunction is also possible: for example, it is possible to use ZnO in the form of an n-doped nanowire, and then to add quantum wells based on ZnO and to use the element 9 made of electrically p-doped GaN. In point of fact, it is currently difficult to p-dope ZnO.

FIG. 8 illustrates a particular example of the optoelectronic device obtained from the manufacturing process. It thus features the substrate 1, preferably made of silicon and configured so as to be electrically conductive (for example n-doped), one face of the substrate 1 is oriented toward the nucleation layer 2. From this nucleation layer 2 extends the nanowire 3. The term "extends" means that the nanowire 3 has a length defined between two longitudinal ends 3a, 3b, a first longitudinal end 3b being in contact with the nucleation layer 2 and a second longitudinal end 3a being distant from the nucleation layer 2. The element 9 doped so as to form a junction with the second end 3a of the nanowire 3 may at least partly cover the nanowire 3 at said second end 3a. Preferably, the doped element 9 forms a sheath around the end 3a of the nanowire 3.

Moreover, in the context of an optoelectronic device, it may be advantageous to add quantum wells intended to form confinement zones so as to increase the emission yield of the nanowire 3. Thus, the process for manufacturing the optoelectronic device may comprise a step of forming quantum wells placed at the interface between the nanowire 3 and the electrically doped element 9 of the second type. The quantum wells may be deposited in the form of a shell around the nanowire. The composition of the material constituting the quantum wells is adjusted so that the emission of light takes place at the chosen wavelength. The quantum wells are formed in an additional layer sandwiched between the nanowire and the element 9.

Preferably, nanowires associated with the same nucleation surface are simultaneously polarized by the nitride layer forming the nucleation layer 2. By using a sparingly resistive silicon substrate 1, the electrical resistances of the various transition metals and of their nitrides are correct and in agreement with the literature. An advantage of using the transition metal nitrides described hitherto is effectively that they allow the nucleation and then growth of GaN nanowires, but another important advantage of these materials is that they do not introduce any potential barrier on the passage of the current (unlike AlN, for example).

The invention also relates to any device obtained via one or other of the processes described above, preferably to any device in which the nucleation layer does not contain titanium.

Preferably, the predominant crystallographic structure of the substrate is of orientation [100] at least at the the interface between the substrate and the transition metal layer. This especially makes it possible to reduce the manufacturing costs.

According to an alternative to the embodiment of FIG. 5, the nitridation step comprises a first nitridation substep En1 performed at least partly at a first temperature by imposing an injection of a nitridation gas at a first flow rate, a second nitridation substep En2 performed at least partly at a second temperature greater than or equal to the first temperature by imposing an injection of the nitridation gas at a second flow rate, which may or may not be different (i.e. the first flow rate may be equal to the second flow rate) from the first flow rate.

This alternative of FIG. 5 is illustrated in FIG. 9. Thus, in FIG. 9, the temperature T1 is between 400° C. and 1050° C. (or 1400° C.), especially between 500° C. and 800° C. and preferentially equal to 600° C.

The first substep En1 is divided for the sake of clarity into two steps: step 1 and step 2.

In step 1 of FIG. 9, a temperature rise up to T1 (i.e. the first temperature) is observed. The carrier gases are $N_2$, $N_2+H_2$ or $H_2$, preferentially $N_2$. The nitridation gas injected may be ammonia ($NH_3$) and the injection may commence at a temperature between room temp. (representative of room temperature) and T1; especially at and above 200° C. The temperature increase ramp from room temp. to T1 is greater than 1° C./min, and especially equal to 1° C./sec. During this step 1, the ammonia flow rate may be between 10×V/18 sccm and 4000×V/18 sccm, especially equal to 1200×V/18 sccm (in which V is the volume of the chamber in litres). In general, the ratio of the flow rates of ammonia to nitrogen ($NH_3/N_2$) may be between 0.0005% and 100%, preferably between 0.0055% and 22% and especially equal to 6.6%.

In step 2 of FIG. 9, annealing at T1 is performed. The carrier gases are $N_2$, $N_2+H_2$ or $H_2$, preferentially $N_2$. The nitridation gas injected may be ammonia ($NH_3$). The ammonia flow rate may be between 10×V/18 sccm and 4000×V/18 sccm, especially equal to 1200×V/18 sccm (in which V is the volume of the chamber in litres). In general, the ratio of the flow rates of ammonia to nitrogen ($NH_3/N_2$) may be between 0.0005% and 100%, preferably between 0.0055% and 22% and especially equal to 6.6%. Preferably, the annealing time under $NH_3$ is greater than 1 second, especially between 5 minutes and 30 minutes.

The second substep En2 is divided for the sake of clarity into three steps: step 3, step 4 and step 5. Preferably, the second temperature T2 is between 400° C. and 1050° C. (or 1400° C.), especially between 500° C. and 1000° C. and preferentially equal to 800° C. In step 3 (if T1≠T2, otherwise the process passes directly to step 4) there is a temperature rise up to T2. The carrier gases are $N_2$, $N_2+H_2$ or $H_2$, preferentially $N_2$. The nitridation gas injected may be ammonia ($NH_3$). The temperature increase ramp from up to T2 is greater than 1° C./minute and especially equal to 1° C./sec. The ammonia flow rate may be between 10×V/18 sccm and 4000×V/18 sccm, especially equal to 1200×V/18 sccm (in which V is the volume of the chamber in litres). In general, the ratio of the flow rates of ammonia to nitrogen ($NH_3/N_2$) may be between 0.0005% and 100%, preferably between 0.0055% and 22% and especially equal to 6.6%.

In step 4, annealing at T2 is performed. The carrier gases are $N_2$, $N_2+H_2$ or $H_2$, preferentially $N_2$. The nitridation gas injected may be ammonia ($NH_3$). The ammonia flow rate may be between 10×V/18 sccm and 4000×V/18 sccm, especially equal to 1200×V/18 sccm (in which V is the volume of the chamber in litres). In general, the ratio of the flow rates of ammonia to nitrogen ($NH_3/N_2$) may be between 0.0005% and 100%, preferably between 0.0055% and 22% and especially equal to 6.6%. The annealing time under $NH_3$ is greater than 1 second, especially between 1 minute and 30 minutes.

In step 5, a temperature decrease is performed. The carrier gases are $N_2$, $N_2+H_2$ or $H_2$, preferentially $N_2$. The nitridation gas injected may be ammonia ($NH_3$). The temperature decrease ramp from T2 to room temp. is greater than 1° C./min and especially equal to 1° C./sec. The ammonia flow rate may be between 10×V/18 sccm and 4000×V/18 sccm, especially equal to 1200×V/18 sccm (in which V is the volume of the chamber in litres). In general, the ratio of the flow rates of ammonia to nitrogen ($NH_3/N_2$) may be between 0.0005% and 100%, preferably between 0.0055% and 22% and especially equal to 6.6%.

As regards this alternative of FIG. 9, the nitridation step may also be performed in a nitridation chamber placed at a pressure of between 50 mbar and 800 mbar, especially 100 mbar, and the step of growth of the nanowire (2) may be performed after the second nitridation substep (En2), or is initiated during the second nitridation substep (En2).

The steps associated with FIG. 5 are preferably performed when the transition metal is Ta (in this case the first temperature is preferentially greater than the second temperature during the nitridation step).

Specifically, for this material, an appreciable improvement is obtained in the quality of the nanowires obtained (verticality, shape homogeneity) relative to the variant of FIG. 9. Conversely, and for the same reasons, the variant of FIG. 9 applies most particularly when it is sought to nitride the transition metal of Ti, Zr, Hf or Nb type (in this case the first temperature is preferentially less than the second temperature during the nitridation step).

Advantageously, and in a manner applicable to everything that has been stated above, when the transition metal deposited is titanium, the nitridation is performed using a carrier gas which comprises hydrogen, especially in $H_2$ form. Tests have demonstrated that, in this case, the nanowire growth yield was improved in the presence of hydrogen.

The invention claimed is:

1. A process for growing at least one semiconductor nanowire, the growing process comprising:
   forming, on a substrate, a nucleation layer for the growth of the nanowire, and
   growing the nanowire,
   wherein the step of forming the nucleation layer comprises:
   depositing onto the substrate a layer of a transition metal selected from the group consisting of Ti, V, Cr, Zr, Nb, Mo, Hf, and Ta, and performing nitridation of at least part of the transition metal layer so as to form a transition metal nitride layer having a surface intended for the growth of the nanowire,
wherein the substrate is silicon, and wherein a thickness of the transition metal layer before nitridation is in a range of from 2 nm to 50 nm.

2. The process as claimed in claim 1, wherein the nitridation comprises:
a first nitridation at least partly performed at a first temperature by imposing an injection of a nitridation gas at a first flow rate, and
a second nitridation at least partly performed at a second temperature less than or equal to the first temperature by imposing an injection of the nitridation gas at a second flow rate which may or may not be different from the first flow rate.

3. The process as claimed in claim 2, wherein the injected nitridation gas is ammonia, and wherein:
the first temperature is between 1000° C. and 1050° C.,
the first flow rate is between 500*V/8 sccm and 2500*V/8 sccm,
the second temperature is between 950° C. and 1050° C., and
the second flow rate is between 500*V/8 sccm and 2500*V/8 sccm,
wherein V is a total capacity in liters of a corresponding nitridation chamber.

4. The process as claimed in claim 2, wherein the nitridation is performed in a nitridation chamber placed at a pressure of between 50 mbar and 800 mbar.

5. The process as claimed in claim 2, wherein the growing of the nanowire is performed after the second nitridation.

6. The process as claimed in claim 1, wherein the growing of the nanowire comprises injecting Ga so as to form the nanowire as a gallium nitride nanowire, the nanowire extending from the growth surface of the nucleation layer.

7. The process as claimed in claim 1, wherein the substrate is silicon, and wherein the depositing of the transition metal layer is configured so that interdiffusion of silicon into the deposited transition metal layer is less than 10 nm and/or so as to conserve a non-silicidized slice of the transition metal layer of at least 2 nm.

8. The process as claimed in claim 1, wherein the deposited transition metal is chosen from Cr, V and Ti, and wherein the transition metal is deposited at a temperature below 100° C.

9. The process as claimed in claim 1, wherein the depositing of the transition metal layer and the nitridation are implemented before the growth step.

10. A process for manufacturing an optoelectronic device, comprising:
growing a nanowire by the process as claimed in claim 1,
performing doping with a dopant of a first type of an end of the nanowire opposite the substrate so as to modify the electrical properties of the end of the nanowire opposite the substrate, and
forming an element doped with a dopant of a second type opposite the first type at the end of the nanowire opposite the substrate so as to modify the electrical properties of the element.

11. The process as claimed in claim 1, wherein the transition metal is selected from the group consisting of V, Cr, Nb, Mo, and Ta, and a crystallographic structure of the transition metal nitride layer is a face-centered cubic crystallographic structure.

12. The process as claimed in claim 11, wherein the face-centered cubic crystallographic structure is oriented so that the nanowire is grown along a [111] direction of the face-centered cubic crystallographic structure of the transition metal nitride layer.

13. The process as claimed in claim 1, wherein the transition metal is selected from the group consisting of Ti, Zr, and Hf, and a crystallographic structure of the transition metal nitride layer is a hexagonal crystallographic structure.

14. The process as claimed in claim 13, wherein the hexagonal crystallographic structure is oriented so that the nanowire is grown along a [0001] direction of the hexagonal crystallographic structure of the transition metal nitride layer.

15. The process as claimed in claim 3, wherein at least one of:
the first temperature is equal to 1050° C.,
the first flow rate is equal to 1600*V/8 sccm,
the second temperature is equal to 1000° C., and
the second flow rate is equal to 500*V/8 sccm.

16. The process as claimed in claim 4, wherein the nitridation chamber is placed at a pressure of 100 mbar.

17. The process as claimed in claim 1, wherein the nitridation of the transition metal layer is performed so as to at least partly modify the transition metal layer into a transition metal nitride layer having a face-centered cubic crystallographic structure or a hexagonal crystallographic structure.

18. The process as claimed in claim 1, wherein interdiffusion of silicon into the deposited transition metal layer is less than 10 nm.

19. The process as claimed in claim 1, wherein the transition metal layer includes a non-silicidized slice of at least 2 nm.

20. The process as claimed in claim 1, wherein the nanowire is oriented substantially perpendicular to the substrate.

* * * * *